US012585370B2

(12) United States Patent
Zheng et al.

(10) Patent No.: US 12,585,370 B2
(45) Date of Patent: Mar. 24, 2026

(54) DISPLAY PANEL, METHOD FOR MANUFACTURING THE SAME, AND DISPLAY DEVICE

(71) Applicant: HUBEI YANGTZE INDUSTRIAL INNOVATION CENTER OF ADVANCED DISPLAY CO., LTD., Wuhan (CN)

(72) Inventors: Yaofei Zheng, Shanghai (CN); Haocheng Wang, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 0 days.

(21) Appl. No.: 18/801,587

(22) Filed: Aug. 12, 2024

(65) Prior Publication Data

US 2024/0402861 A1 Dec. 5, 2024

(30) Foreign Application Priority Data

Aug. 15, 2023 (CN) .......................... 202311037399.6

(51) Int. Cl.
G06F 3/041 (2006.01)
G06F 3/047 (2006.01)
(Continued)

(52) U.S. Cl.
CPC ............ G06F 3/047 (2013.01); G06F 3/0412 (2013.01); H10K 59/1201 (2023.02);
(Continued)

(58) Field of Classification Search
None
See application file for complete search history.

(56) References Cited

U.S. PATENT DOCUMENTS

2023/0305653 A1 9/2023 Li et al.
2024/0176454 A1* 5/2024 Hasegawa ............... G06F 3/041

FOREIGN PATENT DOCUMENTS

CN 113241366 A 8/2021
CN 113394242 A * 9/2021
(Continued)

OTHER PUBLICATIONS

Translation of CN-113394242-A into English; Cao et al. (Year: 2021).*

*Primary Examiner* — Brian M Butcher
(74) *Attorney, Agent, or Firm* — KILPATRICK TOWNSEND & STOCKTON LLP

(57) ABSTRACT

A display panel, a method for manufacturing the same, and a display device. The display panel includes a substrate; a packaging layer at a side of the substrate, including an organic packaging layer comprising a first packaging portion and a second packaging portion different in thickness, a display region of the display panel including a first region and a second region in which the first packaging portion and the second packaging portion are disposed, respectively; a touch-control electrode at a side of the packaging layer away from the substrate, being a mesh electrode including first metal lines, an absolute difference between an average width of the first metal lines in the first region and an average width of the multiple first metal lines in the second region ranges from 0 to 32 μm, and the first metal lines in the second region being subject to width compensation.

20 Claims, 9 Drawing Sheets

(51) Int. Cl.

| | | |
|---|---|---|
| *H10K 59/12* | (2023.01) | |
| *H10K 59/40* | (2023.01) | |
| *H10K 59/80* | (2023.01) | |
| *H10K 59/35* | (2023.01) | |
| *H10K 102/00* | (2023.01) | |

(52) U.S. Cl.

CPC ........... *H10K 59/40* (2023.02); *H10K 59/873* (2023.02); *G06F 2203/04103* (2013.01); *G06F 2203/04107* (2013.01); *G06F 2203/04111* (2013.01); *H10K 59/35* (2023.02); *H10K 2102/311* (2023.02)

(56)                    References Cited

FOREIGN PATENT DOCUMENTS

| CN | 113725391 | A | 11/2021 |
|---|---|---|---|
| CN | 113394242 | B | 7/2022 |

* cited by examiner

105

10

200

100

101

1011(101)

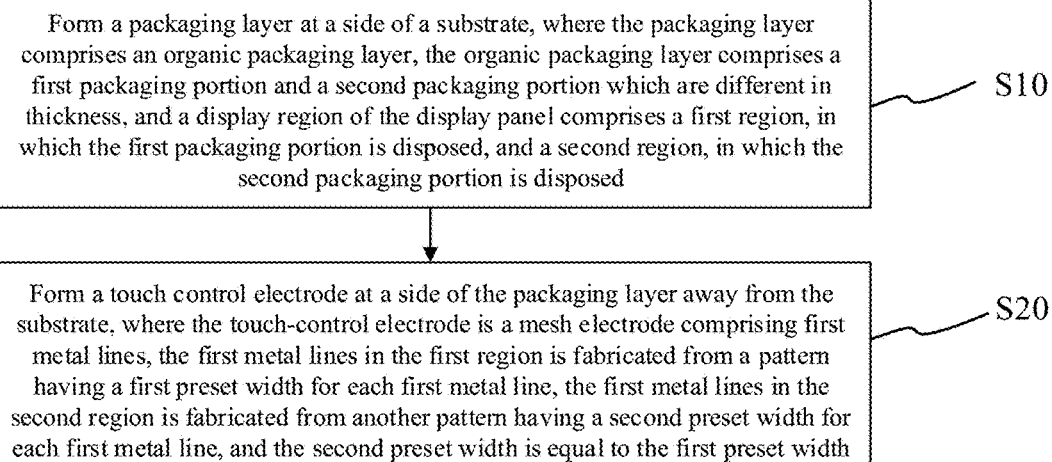

Form a packaging layer at a side of a substrate, where the packaging layer comprises an organic packaging layer, the organic packaging layer comprises a first packaging portion and a second packaging portion which are different in thickness, and a display region of the display panel comprises a first region, in which the first packaging portion is disposed, and a second region, in which the second packaging portion is disposed — S10

Form a touch control electrode at a side of the packaging layer away from the substrate, where the touch-control electrode is a mesh electrode comprising first metal lines, the first metal lines in the first region is fabricated from a pattern having a first preset width for each first metal line, the first metal lines in the second region is fabricated from another pattern having a second preset width for each first metal line, and the second preset width is equal to the first preset width plus a compensation width — S20

Figure 11

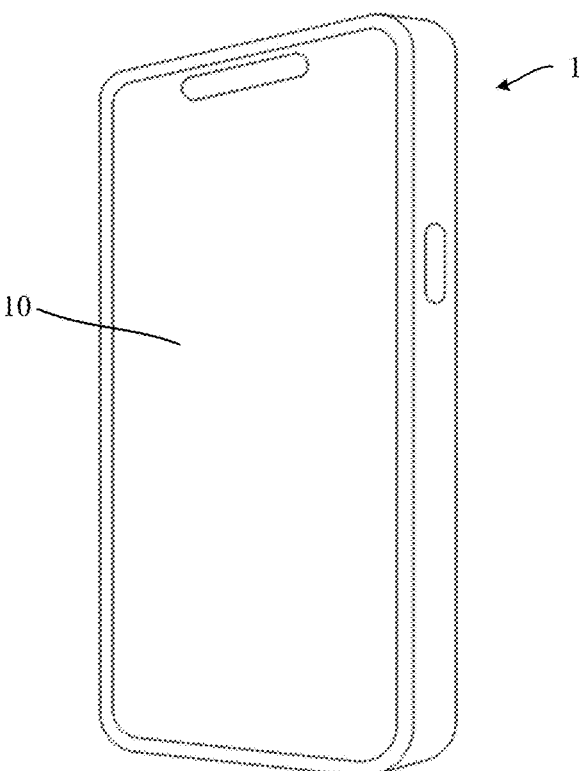

Figure 12

DISPLAY PANEL, METHOD FOR MANUFACTURING THE SAME, AND DISPLAY DEVICE

CROSS-REFERENCES TO RELATED APPLICATIONS

The present disclosure claims the priority to Chinese Patent Application No. 202311037399.6, titled "DISPLAY PANEL, METHOD FOR MANUFACTURING THE SAME, AND DISPLAY DEVICE", filed on Aug. 15, 2023 with the China National Intellectual Property Administration, the content of which is incorporated herein by reference.

FIELD

The present disclosure relates to the field of display, and in particular to a display panel, a method for manufacturing the display panel, and a display device.

BACKGROUND

Organic light-emitting diodes (OLEDs) are also called organic electroluminescence display or organic light-emitting semiconductor. OLED panels are thinner, more lightweight, higher in luminescence, lower in power consumption, faster in response, more flexible, and higher in light-emitting efficiency, in comparison with traditional liquid crystal display (LCD) panels. Hence, the OLED panels are capable to meet recent requirements of consumers on display technology, and thus have gradually become a research focus of major manufacturers. The lightweight and flexibility of the OLED panels further promotes research on foldable and flexible display panels.

In conventional technology, the display panel includes a packaging layer and a touch-electrode layer. The touch-electrode layer is disposed on the packaging layer and is configured to implement a touch-control function of the display panel. The conventional display panels suffer from low touch-control sensitivity at positions close to a boundary of a display region.

SUMMARY

A display panel, a method for manufacturing the display panel, and a display device are provided according to embodiments of the present disclosure. An issue of low touch sensitivity at positions close to a boundary of a display region in display panels is addressed.

In one embodiment, a display panel is provided according to embodiments of the present disclosure. The display panel includes a substrate, a packaging layer, and a touch-control electrode. The packaging layer is disposed at a side of the substrate and includes an organic packaging layer. The organic packaging layer includes a first packaging portion and a second packaging portion, which are different in thickness. A display region of the display panel includes a first region and a second region, the first packaging portion is disposed in the first region, and the second packaging portion is disposed in the second region. The touch-control electrode is disposed at a side of the packaging layer away from the substrate. The touch-control electrode is a mesh electrode including multiple first metal lines. An average width of the multiple first metal lines in the first region is equal to a first width, and an average width of the multiple first metal lines in the second region is equal to a compensated width. The multiple first metal lines are subject to width compensation in the second region. An absolute difference between the first width and the compensated width ranges from 0 to 0.32 μm.

In one embodiment, a method for manufacturing a display panel is further provided according to embodiments of the present disclosure. The method include: forming a packaging layer at a side of a substrate, where the packaging layer includes an organic packaging layer, the organic packaging layer includes a first packaging portion and a second packaging portion which are different in thickness, a display region of the display panel includes a first region and a second region, the first packaging portion is disposed in the first region, and the second packaging portion is disposed in the second region; and forming a touch-control electrode at a side of the packaging layer away from the substrate, where the touch-control electrode is a mesh electrode includes multiple first metal lines, the multiple first metal lines in the first region is fabricated from a pattern having a first preset width for each first metal line, the multiple first metal lines in the second region is fabricated from another pattern having a second preset width for each first metal line, and the second preset width is equal to the first preset width plus a compensation width.

In one embodiment, a display device is further provided according to embodiments of the present disclosure. The display device includes the display panel provided in the embodiments.

According to embodiments of the present disclosure, the display region of the display panel includes the first region in which the first packaging portion is disposed and the second region in which the second packaging portion is disposed. That is, the display region is divided into the first region and the second region according to a degree of an influence of the coffee-ring effect on it. The organic packaging layer in the first region is not affected by the coffee-ring effect, while the organic packaging layer in the second region is affected by the coffee-ring effect. Accordingly, the first metal line(s) in the second region is are compensated in width, and the absolute difference between the average width of the first metal line(s) in the second region and the average width of the first metal line(s) in the first region ranges from 0 to 0.32 μm after the width compensation. In this way, the final width difference between the first metal line(s) in the second region and the first metal line(s) in the first region can be effectively reduced, and the width of the first metal line(s) in the second region to the design value is closer to a designated width. The touch-control sensitivity of the display panel is improved at the positions close to the boundary of the display region.

BRIEF DESCRIPTION OF THE DRAWINGS

FIG. 11 is a flowchart of a method for manufacturing a display panel according to an embodiment of the present disclosure.

FIG. 12 is a schematic structural diagram of a display device according to an embodiment of the present disclosure.

DETAILED DESCRIPTION OF EMBODIMENTS

Figure 1:
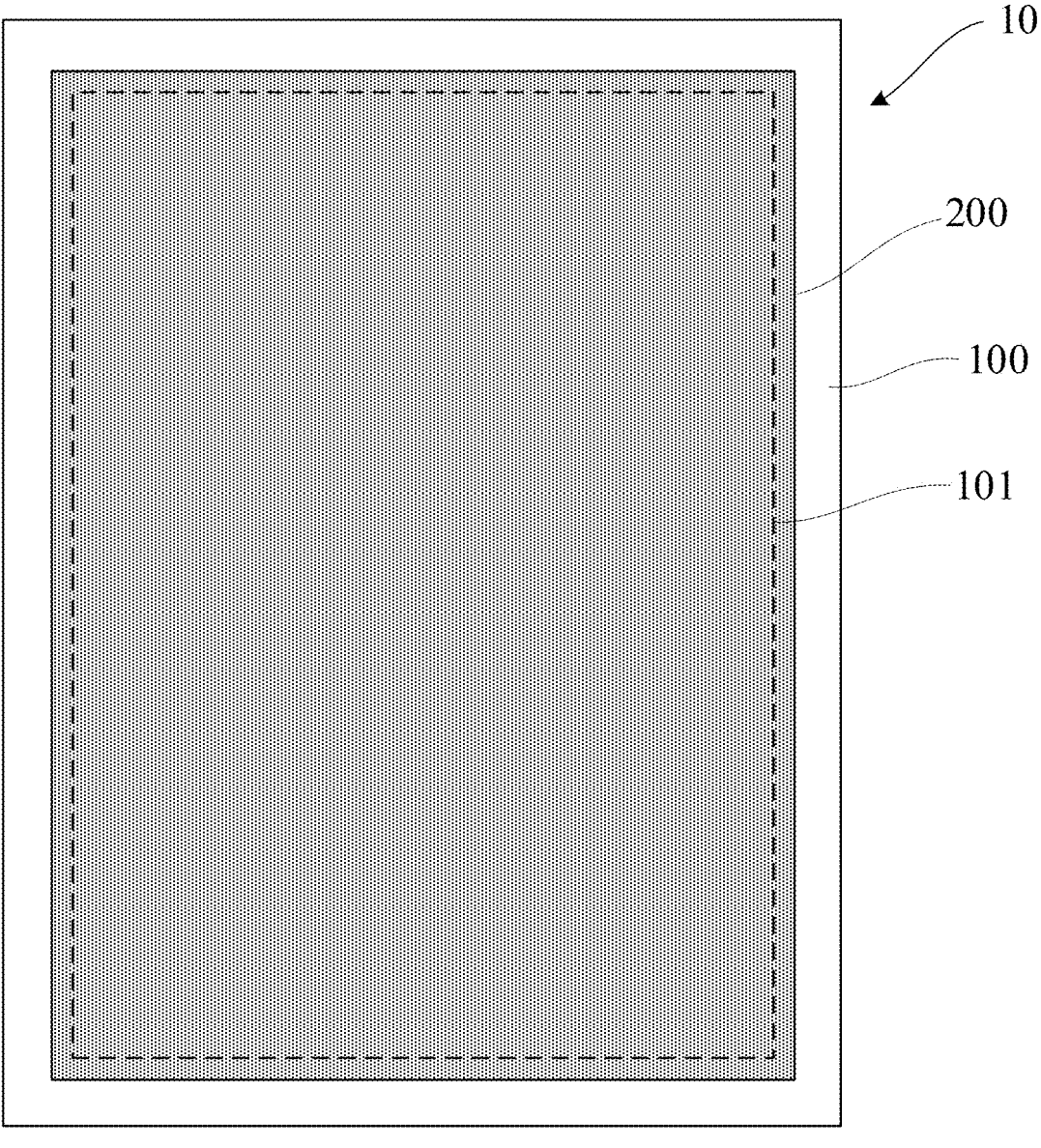
FIG. 1 is a schematic structural diagram of a display panel according to an embodiment of the present disclosure.

In order to facilitate understanding of the present disclosure, hereinafter the present disclosure is described in detail in conjunction with the drawings. The drawings show some embodiments of the present disclosure. The present disclosure may be implemented in various forms and is not limited to embodiments described herein. The embodiments described herein are intended for clarifying and elucidating contents of the present disclosure.

The terms are merely intended for describing some embodiments, rather than limiting the present disclosure. The term "and/or" used herein refers to any or all combinations including one or more correlated items that are listed.

Unless otherwise specified in a positional relationship, an element such as a layer, a film, or a substrate that is described as "on" another element refers to that the element is directly on the other element or that there may be an intermediate element between the element and the other element, unless otherwise specified. Similarly, an element that is described as "under" other layer indicates that the element is directly beneath the other layer or that there may be one or more intermediate elements between the element and other element. An element that is described as "between" two elements indicates that the element is the only element between the two layers or that there may be one or more other intermediate elements between the two elements.

Herein the terms "include", "have", and "comprise" indicates a case in which an element which is not explicitly listed may be present, unless a limitation such as "only" or "composed of" is specified. Unless otherwise mentioned, a term in a singular form can indicate a case of a plural of items and shall not be limited to a case of only one.

Herein the terms such as "first" and "second" are intended for describing various elements rather than limiting the elements. These terms are only configured to distinguish one element from another. For example, as an alternative not departing from a scope of the present disclosure, a first element may be called a second element, and a second element may be called a first element.

Even when not explicitly expressed, interpretation of an element shall include a range of error, and the range of error conforms to understanding of deviations for a specific value. For example, the terms "about", "approximate" or "essentially" each generally refers to a range within one or more standard deviations, which is not limited herein.

In addition, herein the term "schematic view of two-dimensional distribution" refers to a diagram of a target observed from its above, and the term "schematic cross-sectional view" refers to a diagram of a cross section which is obtained through cutting a target and observed along a lateral direction.

In addition, the drawings are not drawn to a scale of 1:1. Relative dimensions of between different elements are merely illustrative in the drawings and may not follow an actual ratio strictly.

As described in the background, conventional display panels suffer from low touch sensitivity at positions close to a boundary of a display region. In-depth research reveals that the above issue a consequence of following processing. Generally, an organic packaging layer in a packaging structure is formed through ink-jet printing. When being dried after the inkjet printing, an ink protrudes at positions close to its edge due to the coffee ring effect, and at least a part the protrusion is located in the display region. When fabricating a touch-control electrode subsequently, a photoresist coated on the ink becomes thinner at the protrusion, and hence a width of a metal line (which is a predecessor of the touch-control electrode) formed at such position after exposure and development would be significantly less than an expected width in design. That is, an actual width of the metal line differs significantly from the designated width, which results in reduction of the touch sensitivity at the positions close to the boundary of the display region.

Inventor's research reveals that the above problem can be overcome at least to some extent through compensating the width of the metal line in a region affected by the coffee-ring effect. According to embodiments of the present disclosure, a display panel includes a substrate, a packaging layer, and a touch-control electrode. The packaging layer is disposed at a side of the substrate and includes an organic packaging layer. The organic packaging layer includes a first packaging portion and a second packaging portion, which are different in thickness. A display region of the display panel includes a first region and a second region, the first packaging portion is disposed in the first region, and the second packaging portion is disposed in the second region. The touch-control electrode is disposed at a side of the packaging layer away from the substrate. The touch-control electrode is a mesh electrode including multiple first metal lines. An average width of a first part of the multiple first metal lines, which is located in the first region, is equal to a first width, and a second part of the multiple first metal lines, which is located in the second region, is equal to a compensated width. The second part of the multiple first metal lines is subject to width compensation. An absolute difference between the first width and the compensated width ranges from 0 to 0.32 μm.

In one embodiment, a width difference between the first metal line(s) in the second region and the first metal line(s) in the first region is reduced through compensating the width of the first metal line(s) in the second region. Hence, the width of the first metal line(s) in the second region to the design value is closer to a designated width. The touch-control sensitivity of the display panel is improved at the positions close to the boundary of the display region.

Hereinabove is a key concept of the present disclosure, and hereinafter the embodiments of the present disclosure would be described in conjunction with the drawing.

Figure 2:
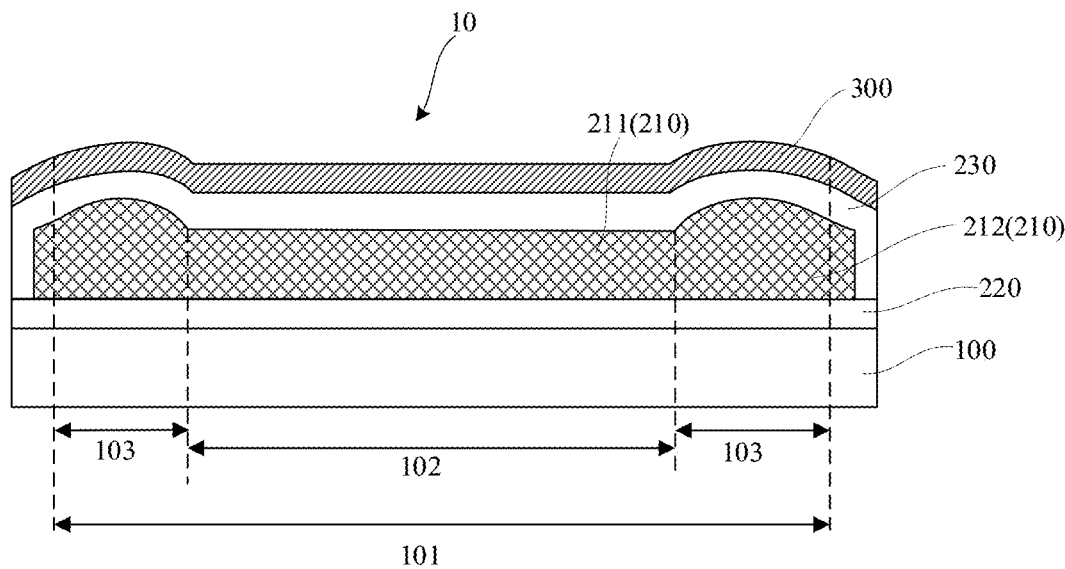
FIG. 2 is a schematic cross-sectional view of a display panel according to an embodiment of the present disclosure.

FIG. 1 is a schematic structural diagram of a display panel according to an embodiment of the present disclosure. FIG. 2 is a schematic cross-sectional view of a display panel according to an embodiment of the present disclosure. As shown in FIG. 1 and FIG. 2, the display panel 10 provided herein has a display region 101. The display panel 10 includes a substrate 100, a packaging layer 200, and a touch-control electrode. The packaging layer 200 is disposed at a side of the substrate 100. The packaging layer 200 includes an organic packaging layer 210, and the organic packaging layer 210 includes a first packaging portion 211 and a second packaging portion 212 which are different in thickness. The display region 101 includes a first region 102 and a second region 103, the first packaging portion 211 is disposed in the first region 102, and the second packaging portion 212 is disposed in the second region 103. The touch-control electrode is disposed at a side of the packaging layer 200 away from the substrate 100. The touch-control electrode is a mesh electrode, and the mesh electrode includes multiple first metal lines. The first metal line(s) in the second region 103 is subject to width compensation (i.e., a width thereof has been compensated). An average width of the first metal line(s) in the first region 102 is equal to a first width, an average width of the first metal line(s) in the second region 103 is equal to a compensated width, and an absolute difference between the first width and the compensated width ranges from 0 $\mu$m to 0.32 $\mu$m.

In an embodiment, a flexible OLED display panel 10 serves as the display panel 10.

Figure 3:
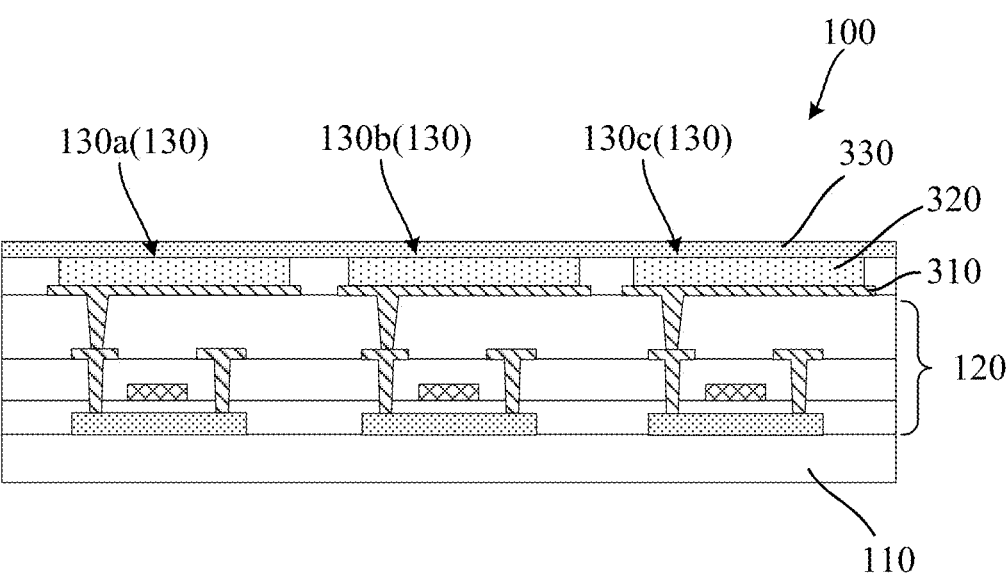
FIG. 3 is a schematic cross-sectional view of a substrate according to an embodiment of the present disclosure.

FIG. 3 is a schematic cross-sectional view of a substrate according to an embodiment of the present disclosure. As shown in FIG. 3, the substrate 100 in the display panel 10 includes a base 110, a driving-circuit layer 120 disposed at a side of the base 110, and a group of display layers disposed at a side of the driving-circuit layer 120 away from the base. The group of display layers includes multiple light-emitting elements 130. The multiple light-emitting elements 130 include a first light-emitting element 130$a$ for emitting light of a first color, a second light-emitting element 130$b$ for emitting light of a second color, and a third light-emitting element 130$c$ for emitting light of a third color. For example, the first color, the second color, and the third color may be red, green, and blue, respectively.

The packaging layer 200 may include an inorganic packaging layer and the organic packaging layer 210 which are stacked. The inorganic packaging layer is mainly configured to block water vapor and oxygen, and the organic packaging layer 210 is mainly configured to provide flexibility. The organic packaging layer 210 is usually fabricated through inkjet printing. The organic packaging layer 210 includes the first packaging portion 211 and the second packaging portion 212. The second packaging portion 212 and the first packaging portion 211 are different in thickness. The second packaging portion 212 of the organic packaging layer 210 is affected by the coffee-ring effect during the fabrication, and the first packaging portion 211 is not affected by the coffee-ring effect. It is appreciated that the second packaging portion 212 is closer to a boundary of the display region 101 than the first packaging portion 211.

The touch-control electrode may be a common mesh electrode. The mesh electrode includes the multiple first metal lines. The multiple first metal lines may be arranged in a crisscross pattern to form a mesh structure.

Herein the display region 101 includes the first region 102 and the second region 103. The first packaging portion 211 of the organic packaging layer 210 is disposed in the first region 102, while the second packaging portion 212 is disposed in the second region 103. That is, the display region 101 is divided into the first region 102 and the second region 103 according to different influences of the coffee-ring effect on the organic packaging layer 210. That is, the organic packaging layer 210 is not affected by the coffee-ring effect in the first region 102, and the organic packaging layer 210 is affected by the coffee-ring effect in the second region 103. In one embodiment, the width of the first metal line(s) in the second region 103 is compensated, and the absolute difference between the average width of the width-compensated first metal line(s) in the second region 103 and the average width of the first metal line(s) in the first region 102 ranges from 0 $\mu$m to 0.32 $\mu$m. Hence, the width difference between the first metal line in the second region 103 and the first metal line in the first region 102 is reduced, and the width of the first metal line(s) in the second region 103 is closer to the designated width. The touch sensitivity of the display panel 10 is thus improved at the positions closer to the boundary of the display region 101.

In addition, when the above width difference is effectively reduced and the width of the first metal line(s) in the second region 103 is close to the designated width, the first metal lines are less likely to break, which improves robustness of performances of the display panel 10.

Figure 4:
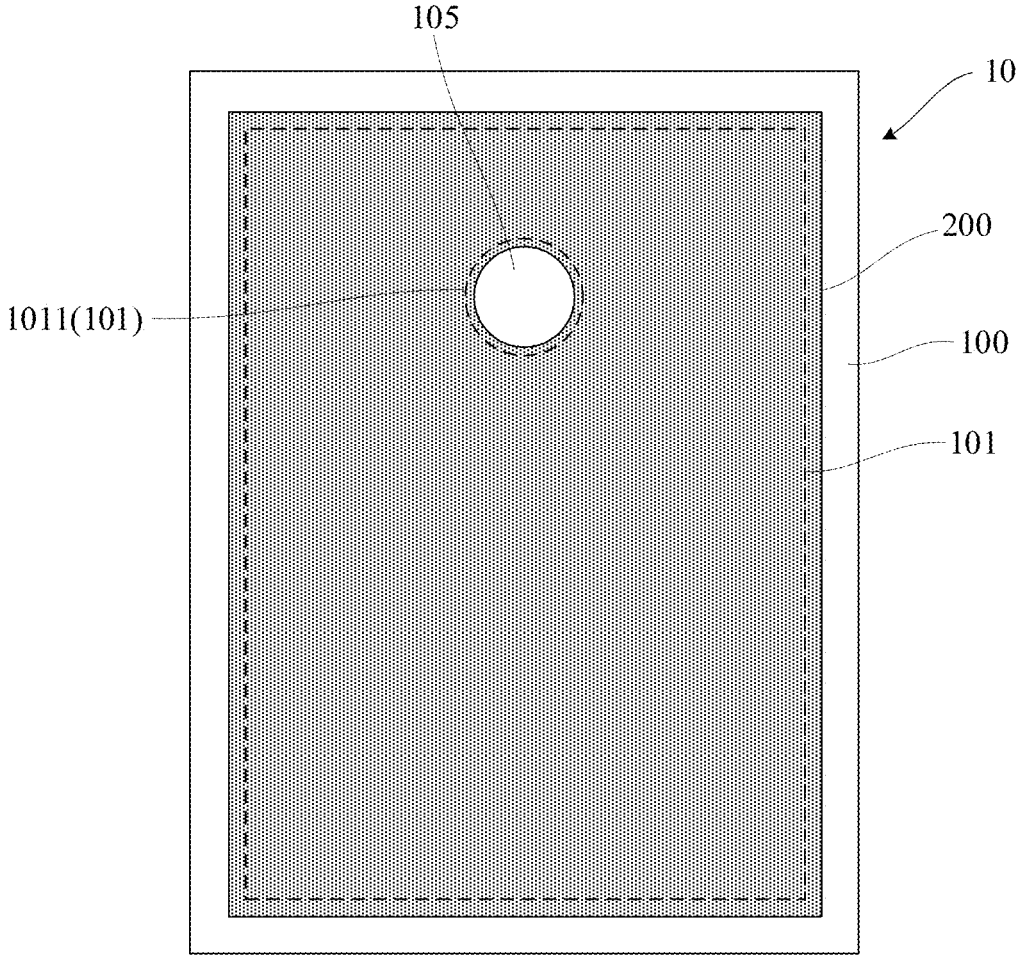
FIG. 4 is a schematic structural diagram of a display panel according to another embodiment of the present disclosure.
Figure 5:
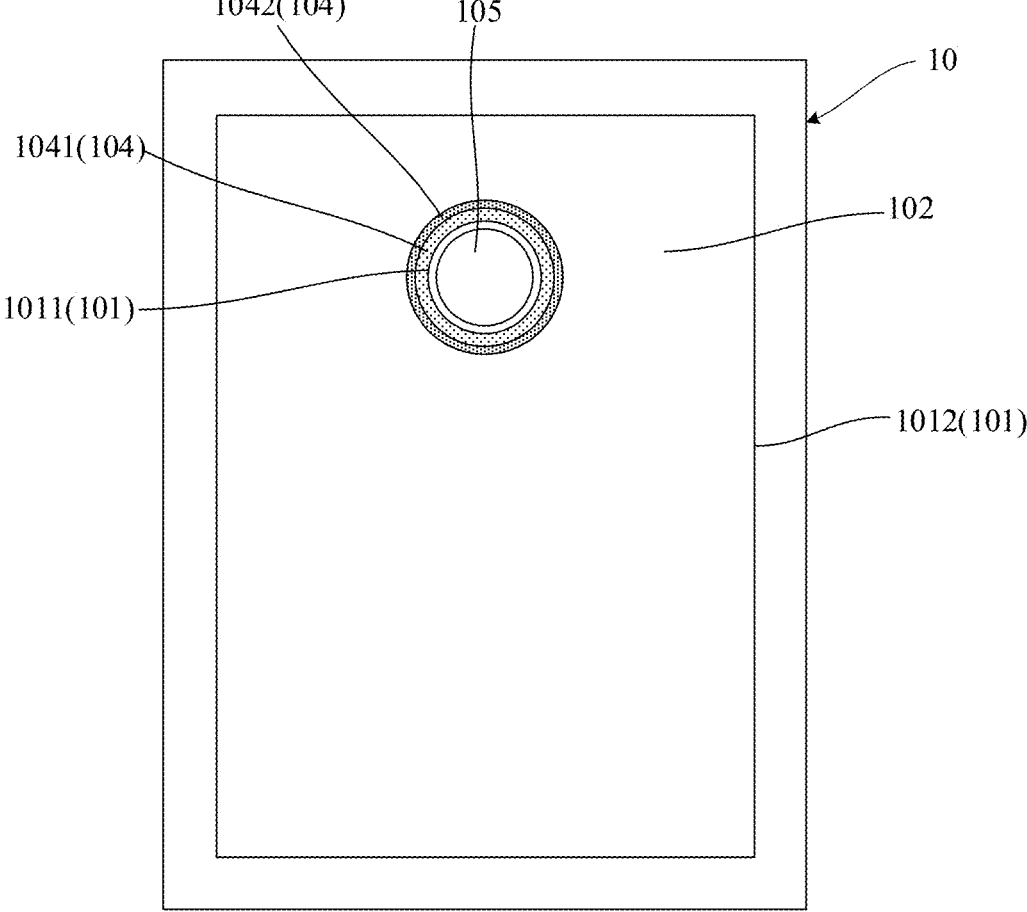
FIG. 5 is a schematic diagram of a first sub-region of a display panel according to an embodiment of the present disclosure.

FIG. 4 is a schematic structural diagram of another display panel according to an embodiment of the present disclosure, and FIG. 5 is a schematic diagram of a first sub-region of a display panel according to an embodiment of the present disclosure. As shown in FIG. 4 and FIG. 5, the display panel 10 further has an opening region 105 (a region provided with an opening), and the display region 101 surrounds the opening region 105. The display region 101 has an inner boundary 1011 adjacent to the opening region 105, and the second region 103 includes a first sub-region 104 adjacent to the inner boundary 1011. The first sub-region 104 is divided into a first compensation region 1041 and a second compensation region 1042. The first compensation region 1041 is annular and surrounds the opening region 105, and an inner edge of the first compensation region 1041 coincides with the inner boundary 1011. The second compensation region 1042 is annular and surrounds the first compensation region 1041, and an inner edge of the second compensation region 1042 coincides with an outer edge of the first compensation region 1041. A radial distance between the outer edge of the first compensation region 1041 and the inner edge of the first compensation region 1041 ranges from 850 $\mu$m to 950 $\mu$m. A radial distance between an outer edge of the second compensation region 1042 and the inner edge of the second compensation region 1042 ranges from 550 $\mu$m to 650 $\mu$m. An average width of the first metal line(s) in the first compensation region 1041 is equal to a second width, and an average width of the first metal line(s) in the second compensation region 1042 is equal to a third width. An absolute difference between a second width and the first width ranges from 0 to 0.27 $\mu$m. An absolute difference between the third width and the first width ranges from 0 to 0.24 $\mu$m.

The opening region 105 may be configured to accommodate to a functional apparatus, such as a camera or a receiver.

The inventor's research reveals that the organic packaging layer 210 is significantly affected by the coffee-ring effect at positions close to the opening region 105, and the organic packaging layer 210 protrudes significantly at such positions. Hence, a width of the first metal line at these positions needs to be compensated. Accordingly, divisions of the second region 103 further include the first sub-region 104 close to the inner boundary 1011 of the display region 101. That is, the first metal line(s) in the first sub-region 104 is subject to width compensation. In one embodiment, a width difference between the first metal line(s) in the first sub-region 104 and the first metal line(s) in the first region 102 can be effectively reduced, and the width of the first metal line(s) at the positions close to the opening region 105 is close to the designated width.

The inventor's research further reveals that the closer a position is to the inner boundary 1011, the more a width of the metal line is smaller than the designated width. Therefore, the width of the first metal line in the first sub-region 104 may be compensated in a stepped manner. In an embodiment, the first sub-region 104 is divided into the first compensation region 1041 and the second compensation region 1042. The first compensation region 1041 is annular and surrounds the opening region 105, and the inner edge of the first compensation region 1041 coincides with the inner boundary 1011. The second compensation region 1042 is annular and surrounds the first compensation region 1041, and the inner edge of the second compensation region 1042 coincides with the outer edge of the first compensation region 1041. For width compensation, an additional width to by which the first metal line(s) in the first compensation region 1041 is compensated is greater than an additional width by which the first metal line(s) in the second compensation region 1042 is compensated. In one embodiment, a better effect of width compensation can be achieved on the first metal line(s) located in the first sub-region 104.

As an example, following division may be performed to obtain the first compensation region 1041 and the second compensation region 1042. The radial distance between the outer edge of the first compensation region 1041 and the inner edge of the first compensation region 1041 ranges from 850 μm to 950 μm. The radial distance between the outer edge of the second compensation region 1042 and the inner edge of the second compensation region 1042 ranges from 550 μm to 650 μm. After the aforementioned stepped width compensation, the absolute difference between the average width of the first metal line(s) in the first compensation region 1041 and the average width of the first metal line(s) in the first region 102 ranges from 0 to 0.27 μm, and the absolute difference between the average width of the first metal line(s) in the second compensation region 1042 and the average width of the first metal line(s) in the first region 102 ranges from 0 to 0.24 μm. That is, the width of the first metal line(s) in the first sub-region 104 is quite close to the designated width, and the touch sensitivity can be improved at the positions close to the opening region 105.

Figure 6:
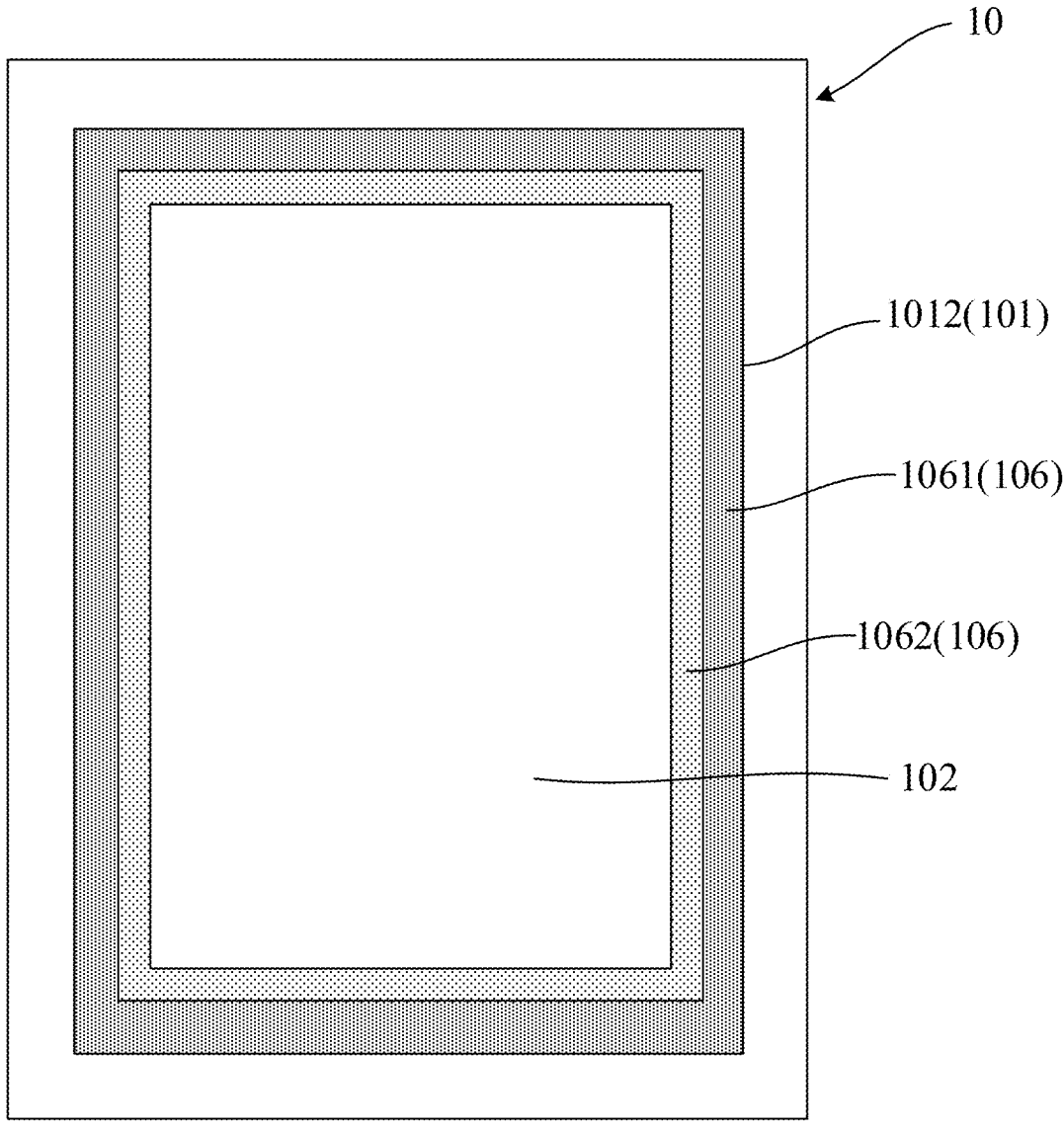
FIG. 6 is a schematic diagram of a second sub-region of a display panel according to an embodiment of the present disclosure.

FIG. 6 is a schematic diagram of a second sub-region of a display panel according to an embodiment of the present disclosure. As shown in FIG. 6, the display region 101 has an outer boundary 1012. The second region 103 includes a second sub-region 106 disposed adjacent to the outer boundary 1012. The second sub-region 106 is divided into a third compensation region 1061 and a fourth compensation region 1062. The third compensation region 1061 is a closed loop (e.g., a rectangular loop), and an outer edge of the third compensation region 1061 coincides with the outer boundary 1012. The fourth compensation region 1062 is another closed loop (e.g., a rectangular loop) surrounding the first region 102. An outer edge of the fourth compensation region 1062 coincides with an inner edge of the third compensation region 1061. A distance between the inner edge of the third compensation region 1061 and the outer edge of the third compensation region 1061 ranges from 850 μm to 950 μm. A distance between an inner edge of the fourth compensation region 1062 and the outer edge of the fourth compensation region 1062 ranges from 550 μm to 650 μm. An average width of the first metal line(s) in the third compensation region 1061 is equal to a fourth width, and an average width of the first metal line(s) in the fourth compensation region 1062 is equal to a fifth width. An absolute difference between the fourth width and the first width ranges from 0 to 0.29 μm. An absolute difference between the fifth width and the first width ranges from 0 to 0.25 μm.

The invertor's research reveals that the organic packaging layer 210 at positions close to the outer boundary 1012 of the display region 101 also suffers from the strong coffee-ring effect and protrudes significantly at these positions. Hence, a width of the first metal line at such positions needs to be compensated. Divisions of the second region 103 may include the second sub-region 106 close to the outer boundary 1012 of the display region 101. That is, the width of the first metal line(s) in the second sub-region 106 is compensated. In one embodiment, the width difference between the first metal line(s) in the second sub-region 106 and the first metal line(s) in the first region 102 can be effectively reduced, and the width of the first metal line at the positions close to the outer boundary 1012 of the display region 101 is closer to the designated width.

The inventor's research further reveals that that the closer a position is to the outer boundary 1012, the more a width of the metal line is smaller than the designated width. Hence, the width of the first metal line(s) in the second sub-region 106 may be compensated in a stepped manner. In an embodiment, the second sub-region 106 is divided into the third compensation region 1061 and the fourth compensation region 1062. The third compensation region 1061 is shaped as a closed loop, and the outer edge of the third compensation region 1061 coincides with the outer boundary 1012. The fourth compensation region 1062 is shaped as another closed loop surrounding the first region 102. The outer edge of the fourth compensation region 1062 coincides with the inner edge of the third compensation region 1061. After the aforementioned stepped width compensation, an additional width by which the first metal line(s) in the third compensation region 1061 is compensated is greater than an additional width by which the first metal line(s) in the fourth compensation region 1062 is compensated. In one embodiment, a better effect of width compensation can be achieved on the first metal line(s) in the second sub-region 106.

As an example, following division may be performed to obtain the third compensation region 1061 and the fourth compensation region 1062. The distance between the inner edge of the third compensation region 1061 and the outer edge of the third compensation region 1061 ranges from 850 μm to 950 μm. The distance between the inner edge of the fourth compensation region 1062 and the outer edge of the fourth compensation region 1062 ranges from 550 μm to 650 μm. After the aforementioned stepped width compensation, the absolute difference between the average width of the first metal line(s) in the third compensation region 1061 and the average width of the first metal line(s) in the first region 102 ranges from 0 to 0.29 μm, and the absolute difference between the average width of the first metal line(s) in the fourth compensation region 1062 and the average width of the first metal line(s) in the first region 102 ranges from 0 to 0.25 μm. That is, the width of the first metal line(s) in the second sub-region 106 is quite close to the designated width, and hence the touch sensitivity is improved at the positions close to the outer edge of the display region 101.

Figure 7:
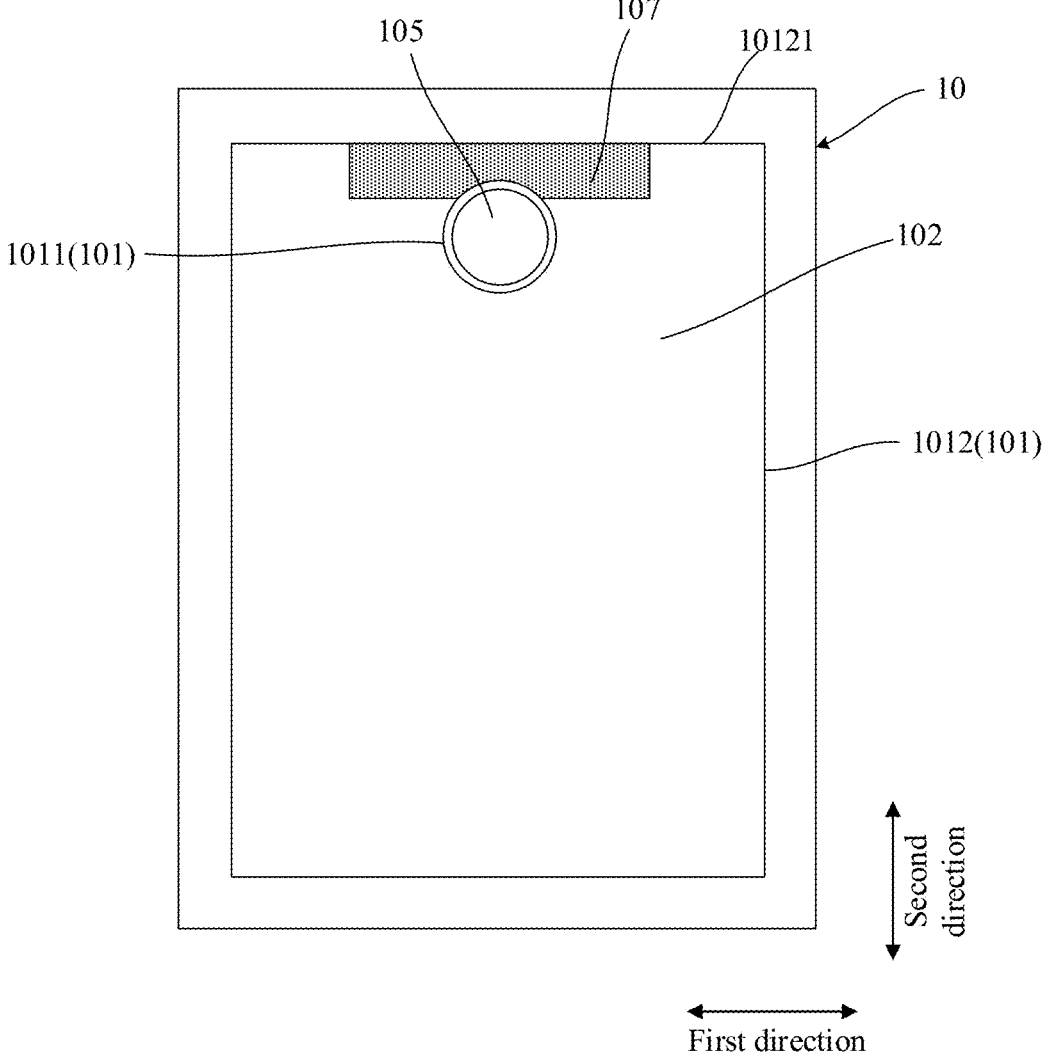
FIG. 7 is a schematic diagram of a third sub-region of a display panel according to an embodiment of the present disclosure.
Figure 8:
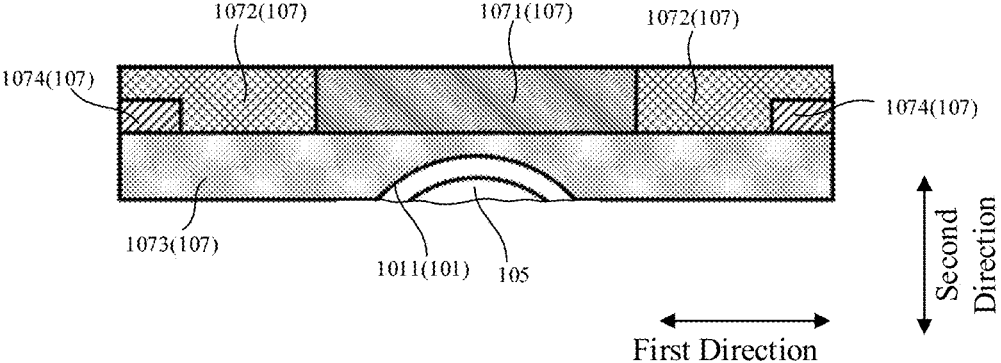
FIG. 8 is a schematic enlarged view of a third sub-region as shown in FIG. 7 according to an embodiment of the present disclosure.

FIG. 7 is a schematic diagram of a third sub-region of a display panel according to an embodiment of the present disclosure, and FIG. 8 is a schematic enlarged view of a third sub-region as shown in FIG. 7 according to an embodiment of the disclosure. Reference is made to FIG. 7 in conjunction with FIG. 8. The display panel 10 further has an opening region 105, and the display region 101 surrounds the opening region 105. The display region 101 has an outer boundary 1012 and an inner boundary 1011 which is adjacent to the opening region 105. The outer boundary 1012 includes a first edge 10121, and a smallest distance between the inner boundary 1011 and the first edge 10121 is less than 3000 μm. The second region 103 includes a third sub-region 107 adjacent to the first edge 10121. The third sub-region 107 is divided into a fifth compensation region 1071, a sixth compensation region 1072, and a seventh compensation region 1073. The fifth compensation region 1071 is located between the inner boundary 1011 and the first edge 10121. An edge of the fifth compensation region 1071 away from the opening region 105 coincides with a portion of the first edge 10121. There are two sixth compensation regions 1072 located at two sides, respectively, of the fifth compensation region 1071 along a first direction. An edge of each sixth compensation region 1072 away from the opening region 105 coincides with the first edge 10121. The seventh compensation region 1073 is arranged at a side, of the fifth compensation region 1071 and the sixth compensation region 1072, away from the first edge 10121. A portion of an edge of the seventh compensation region 1073 coincides with a portion of the inner boundary 101. The first direction is parallel with the first edge 10121.

The first edge 10121 is a segment of the outer boundary 1012. For example, the outer boundary 1012 includes four segments that are sequentially connected, and the first edge 10121 is a segment closest to the opening region 105 among the four segments.

The inventor's research reveals that a small distance between the opening region 105 and the first edge 10121 (for example, a distance between the inner boundary 1011 and the first edge 10121 being less than 3000 μm) would introduce a serious coffee-ring effect on the organic packaging layer 210 in a region between the opening region 105 and the first edge 10121. This is because such region is close to both the outer boundary 1012 of the display region 101 and the inner boundary 1011 of the display region 101, that is, an outer edge of the organic packaging layer 210 in such region is close to the outer boundary 1012 of the display region 101 while its inner edge is close to the inner boundary 1011 of the display region 101. Since both the outer edge and the inner edge suffer from the strong coffee-ring effect, the coffee-ring effects on the two edges inner edge are coupled in such region. Hence, in a case that the distance between the opening region 105 and the outer boundary 1012 of the display region 101 is small, a width of the first metal line in the region between the opening region 105 and the first edge 10121 needs to be compensated. Divisions of the second region 103 may include the third sub-region 107 adjacent to the first edge 10121, and the first metal line(s) in the third sub-region 107 are subject to width compensation. In one embodiment, a width difference between the first metal line(s) in the third sub-region 107 and the first metal line(s) in the first region 102 can be reduced, and the width of the first metal line(s) in the region between the opening region 105 and the first edge 10121 is closer to the designated width.

The width compensation may be further refined as follows. The third sub-region 107 is further divided into the fifth compensation region 1071, the sixth compensation region 1072, and the seventh compensation region 1073. The fifth compensation region 1071 is located between the inner boundary 1011 and the first edge 10121. The edge of the fifth compensation region 1071 far away from the opening region 105 coincides with the portion of the first edge 10121. There may be two sixth compensation regions

1072, which are disposed at two sides, respectively, of the fifth compensation region 1071 along the first direction. The edge of the sixth compensation region 1072 away from the opening region 105 coincides with the first edge 10121. The seventh compensation region 1073 is located at the side, of the fifth compensation region 1071 and the sixth compensation region 1072, away from the first edge 10121. The edge of the seventh compensation region 1073 coincides partially with the inner boundary 1011. In addition, the first metal lines in the fifth compensation region 1071, the sixth compensation region 1072, and the seventh compensation region 1073 are compensated with different additional width, and a better effect of width compensation can be achieved on the first metal line(s) in the third sub-region 107.

In an embodiment, a length of the fifth compensation region 1071 along a second direction is greater than a half, while less than or equal to four fifths, of a distance between the inner boundary 1011 and the first edge 10121. A length of the fifth compensation region 1071 along the first direction is greater than or equal to, while less than or equal to 1.3 times, of a diameter of the opening region 105. The second direction is perpendicular to the first edge 10121. An average width of the first metal line(s) in the fifth compensation region 1071 is equal to a sixth width. An absolute difference between the sixth width and the first width ranges from 0 to 0.32 μm.

In one embodiment, after the width compensation, the absolute difference between the average width of the first metal line(s) in the fifth compensation region 1071 and the average width of the first metal line(s) in the first region 102 ranges from 0 to 0.32 μm. That is, the width of the first metal line(s) in the fifth compensation region 1071 is close to the designated width.

In an embodiment, a length of the sixth compensation region 1072 along the second direction is equal to the length of the fifth compensation region 1071 along the second direction. A length of the sixth compensation region 1072 along the first direction is greater than or equal to one third, while less than or equal to a half, of the length of the fifth compensation region 1071 along the first direction. The second direction is perpendicular to the first edge 10121. An average width of the first metal line(s) in the sixth compensation region 1072 is equal to a seventh width. An absolute difference between the seventh width and the first width ranges from 0 to 0.29 μm.

In one embodiment, after the width compensation, an absolute difference between the average width of the first metal line(s) in the sixth compensation region 1072 and the average width of the first metal line(s) in the first region 102 ranges from 0 to 0.29 μm. That is, the width of the first metal line(s) in the sixth compensation region 1072 is close to the designated width.

In an embodiment, a length of the seventh compensation region 1073 along the second direction is greater than one fifth, while less than or equal to one third, of the distance between the inner boundary 1011 and the first edge 10121. A length of the seventh compensation region 1073 along the first direction is equal to a sum of the length of the fifth compensation region 1071 along the first direction and the lengths of the two sixth compensation regions 1072 along the first direction. The second direction is perpendicular to the first edge 10121. An average width of the first metal line(s) in the seventh compensation region 1073 is equal to an eighth width. An absolute difference between the eighth width and the first width ranges from 0 to 0.26 μm.

In one embodiment, after the width compensation, an absolute difference between the average width of the first metal line(s) in the seventh compensation region 1073 and the average width of the first metal line(s) in the first region 102 ranges from 0 to 0.26 μm. That is, the width of the first metal line(s) in the seventh compensation region 1073 is close to the designated width.

In some embodiments, divisions of the third sub-region 107 further include an eighth compensation region 1074. The eighth compensation region 1074 is between located between the sixth compensation region 1072 and the seventh compensation region 1073 along the second direction. The eighth compensation region 1074 is located at a side of the sixth compensation region 1072 away from the fifth compensation region 1071 along the first direction. The sixth compensation region 1072 is adjacent to at least a part of a peripheral of the eighth compensation region 1074. A length of the eighth compensation region 1074 along the second direction is greater than or equal to one third, while less than or equal to a half, of the length of the sixth compensation region 1072 along the second direction. A length of the eighth compensation region 1074 along the first direction is greater than or equal to one third, while less than or equal to a half, of the length of the sixth compensation region 1072 along the first direction. An average width of the first metal line(s) in the eighth compensation region 1074 is equal to a ninth width. An absolute difference between the ninth width and the first width ranges from 0 to 0.21 μm.

After the width compensation, the absolute difference between the average width of the first metal line(s) in the eighth compensation region 1074 and the average width of the first metal line(s) in the first region 102 ranges from 0 to 0.21 μm. That is, the width of the first metal line(s) in the eighth compensation region 1074 is close to the designated width.

In one embodiment, the third sub-region 107 may be divided into the fifth compensation region 1071, the sixth compensation region 1072, the seventh compensation region 1073, and the eighth compensation region 1074 in a case that the distance between the inner boundary 1011 and the first edge 10121 is less than 3000 μm. A degree of the coffee-ring effect affecting the organic packaging layer 210 decreases gradually from the fifth compensation region 1071, to the sixth compensation region 1072, then to the seventh compensation region 1073, and finally to the eighth compensation region 1074. Therefore, the first metal line(s) in these regions may be compensated by different additional widths. In an embodiment, the additional widths for the first metal line(s) in the fifth compensation region 1071, the sixth compensation region 1072, the seventh compensation region 1073, and the eighth compensation region 1074 are configured in a descending order. In one embodiment, a better effect of width compensation effect can be achieved.

In some embodiments, the mesh electrode further includes a bridging portion, and the bridging portion includes multiple second metal lines. The length of the fifth compensation region 1071 along the second direction is greater than a half, while less than or equal to four fifths, of the distance between the inner boundary 1011 and the first edge 10121. The length of the fifth compensation region 1071 along the first direction is greater than or equal to, while less than or equal to 1.3 times of, the diameter of the opening region 105. The length of the sixth compensation region 1072 along the second direction is equal to the length of the fifth compensation region 1071 along the second direction. The length of the sixth compensation region 1072 along the first direction is greater than or equal to one third, while less than or equal to a half, of the length of the fifth compensation region 1071 along the first direction. The length of the seventh compensation region 1073 along the second direction is greater than one fifth, while less than or equal to one third, of the distance between the inner boundary 1011 and the first edge 10121. The length of the seventh compensation region 1073 along the first direction is equal to a sum of the length of the fifth compensation region 1071 along the first direction and the lengths of the two sixth compensation regions 1072 along the first direction. The second direction is perpendicular to the first edge 10121. An average width of the second metal line in the fifth compensation region 1071 is equal to a tenth width. An absolute difference between the tenth width and the first width ranges from 0 to 0.28 μm. An average width of the second metal line in the sixth compensation region 1072 is equal to an eleventh width. An absolute difference between the eleventh width and the first width ranges from 0 to 0.26 μm. The first metal line(s) in the seventh compensation region 1073 has a twelfth width, and an absolute difference between the twelfth width and the first width ranges from 0 to 0.23 μm.

The inventor's research reveals that in the case that the distance between the inner boundary 1011 and the first edge 10121 is less than 3000 μm, the second metal line in the bridging portion of the touch-control electrode located in the region between the opening region 105 and the first edge 101 also suffers from the issue of an actual width being significantly less than a designated width. Hence, a width of the second metal line in such region needs to be compensated. Besides the first metal line(s) in the third sub-region, the second metal line(s) in the third sub-region 107 may be further subject to width compensation, and the width of the second metal line in the third sub-region 107 is closer to the designated width.

In an embodiment, the third sub-region 107 is divided into the fifth compensation region 1071, the sixth compensation region 1072, and the seventh compensation region 1073. The length of the fifth compensation region 1071 in the second direction is greater than a half, while being less than four fifths, of the distance between the inner boundary 1011 and the first edge 10121. The length of the fifth compensation region 1071 in the first direction is greater than or equal to, while less than or equal to 1.3 times of, the diameter of the opening region 105. The length of the sixth compensation region 1072 along the second direction is equal to the length of the fifth compensation region 1071 along the second direction. The length of the sixth compensation region 1072 along the first direction is greater than or equal to one-third, while less than or equal to a half, of the length of the fifth compensation region 1071 along the first direction. The length of the seventh compensation region 1073 along the second direction is greater than one fifth, while less than or equal to one third, of the distance between the inner boundary 1011 and the first edge 10121. The length of the seventh compensation region 1073 along the first direction is equal to a sum of the length of the fifth compensation region 1071 along the first direction and lengths of the two sixth compensation regions 1072 along the first direction. In addition, respective second metal line(s) in the fifth compensation region 1071, the sixth compensation region 1072, and the seventh compensation region 1073 are compensated by different additional widths.

After the width compensation, an absolute difference between the average width of the second metal line(s) in the fifth compensation region 1071 and the average width of the first metal line(s) in the first region 102 ranges from 0 to 0.28 μm. An absolute difference between the average width of the second metal line(s) in the sixth compensation region 1072 and the average width of the first metal line(s) in the first region 102 ranges from 0 to 0.26 μm. An absolute difference between the average width of the second metal line(s) in the seventh compensation region 1073 and the average width of the first metal line(s) in the first region 102 ranges from 0 to 0.23 μm. That is, the width of the second metal line in the third sub-region 107 is close to the designated width.

Figure 9:
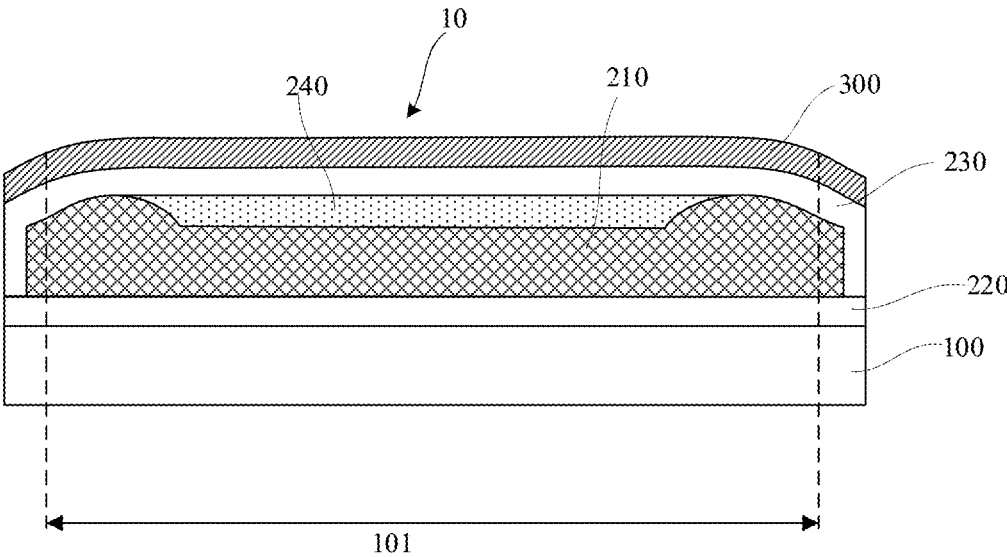
FIG. 9 is a schematic cross-sectional view of a display panel according to another embodiment of the present disclosure.

FIG. 9 is a schematic cross-sectional view of a display panel according to another embodiment of the present disclosure. As shown in FIG. 9, the packaging layer 200 may further include a first inorganic packaging layer 220, a second inorganic packaging layer 230, and a planarization layer 240. The first inorganic packaging layer 220 is disposed at a side of the organic packaging layer 210 facing the substrate 100. The second inorganic packaging layer 230 is disposed at a side of the organic packaging layer 210 away from the first inorganic packaging layer 220. The planarization layer 240 is disposed between the organic packaging layer 210 and the second inorganic packaging layer 230. The planarization layer 240 is located in the first region 102 and a portion of the second region 103.

The planarization layer 240 between the organic packaging layer 210 and the second inorganic packaging layer 230 is configured to improve overall flatness of the packaging layer 200. Hence, the planarization layer 240 also contributes to addressing the issue that the width of the first metal line is significantly reduced in fabrication of the touch-control electrode.

Figure 10:
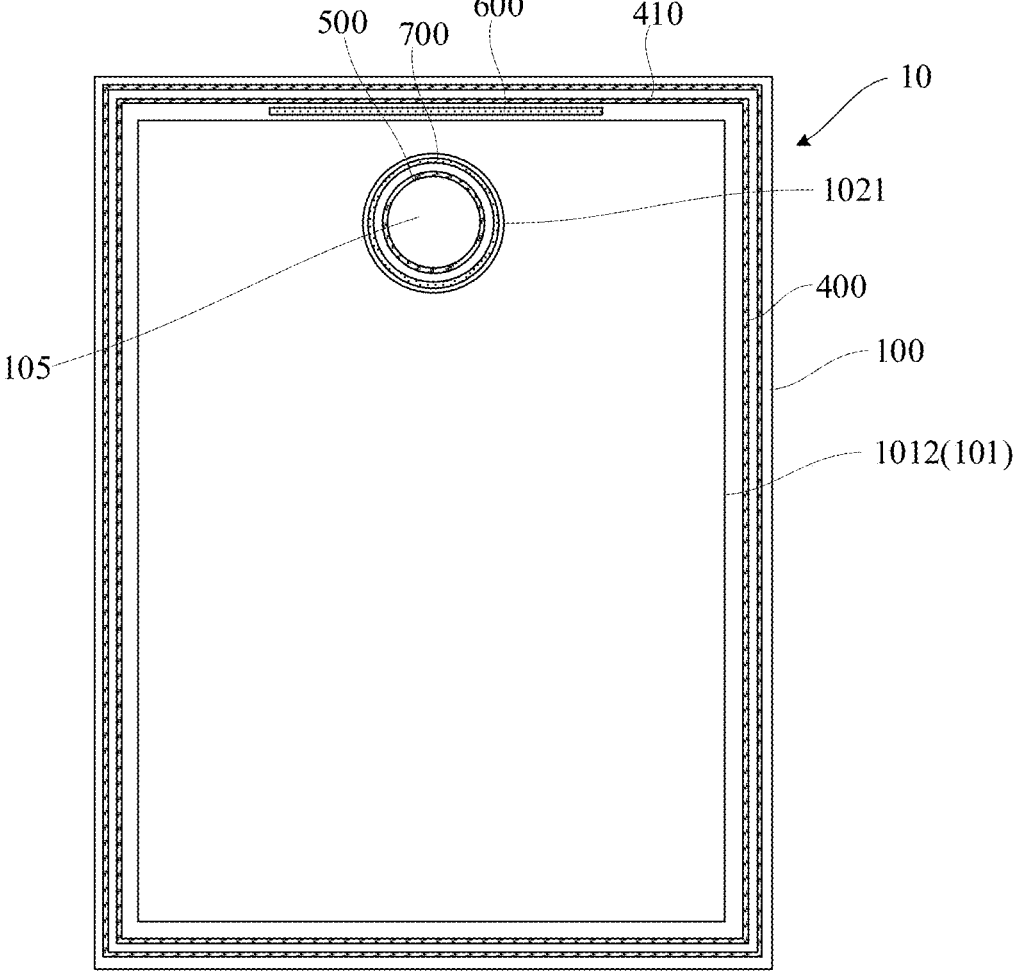
FIG. 10 is a schematic structural diagram of a display panel according to another embodiment of the present disclosure.

FIG. 10 is a schematic structural diagram of a display panel according to another embodiment of the present disclosure. As shown in FIG. 10, the display panel 10 has an opening region 105, a first non-display region, and a second non-display region. The display region 101 surrounds the opening region 105, and an inner boundary 1011 of the display region 101 is adjacent to the opening region 105. The first non-display region surrounds the display region 101. The second non-display region is located between the inner boundary 1011 and the opening region 105. The display panel 10 further includes a first barrier 400, a second barrier 500, a first shielding wall 600, and a second shielding wall 700. The first barrier 400 is located in the first non-display region and surrounds the display region 101. The second barrier 500 is arranged in the second non-display region and surrounds the opening region 105. The first shielding wall 600 is arranged in the first non-display region between the display region 101 and the first barrier 400. The second shielding wall 700 is arranged in the second non-display region between the display region 101 and the second barrier 500.

In an embodiment, the first barrier 400 is a blocking structure surrounding the display region 101 and is configured to prevent an organic material from overflowing toward outside when fabricating the organic packaging layer 210. The second barrier 500 is a blocking structure arranged surrounding the opening region 105 and is configured to preventing the organic material from overflowing into the opening region 105 when fabricating the organic packaging layer 210.

The inventor's research reveals that the flatness of the organic packaging layer 210 can be improved by configuring blocking structure(s) to prevent the organic material from leveling. Hence, herein the first shielding wall 600 may be disposed between the display region 101 and the first barrier 400, and the second shielding wall 700 may be disposed between the display region 101 and the second barrier 500. The first shielding wall 600 and the second shielding wall

700 are capable to prevent the organic material from leveling during fabrication of the organic packaging layer 210. In one embodiment, the flatness of the organic packaging layer 210 is improved, and the width of the first metal line would not shrink during subsequent fabrication of the touch-control electrode.

In an embodiment, the packaging layer 20 includes the first inorganic packaging layer 220 and the second inorganic packaging layer 230. The organic packaging layer 210 is disposed at a side of the first inorganic packaging layer 220 away from the substrate 100, and the second inorganic packaging layer 230 is disposed at a side of the organic packaging layer 210 away from the first inorganic packaging layer 220. An orthographic projection of the first barrier 600 on the substrate 100 is located within an orthographic projection of the organic packaging layer 210 on the substrate 100. An orthographic projection of the second barrier 700 on the substrate 100 is within an orthographic projection of the organic packaging layer 210 on the substrate 100. That is, the first shielding wall 600 and the second shielding wall 700 are both provided to obstruct the organic material only to a certain extent, that is, slow down flowing and diffusion of the organic material instead of stopping it completely. A large number of experiments and simulations have shown that the flatness of the organic packaging layer 210 can be greatly improved through such approach.

In embodiment, the first barrier 400 may include multiple segments, among which a first segment 410 has a minimum distance to the opening region. A direction along which the first shielding wall 600 extends is parallel with a direction along which the first segment 410 extends. In addition, a length of the first shielding wall 600 is greater than or equal to, while smaller than or equal to three times of, the diameter of the opening region 105. Such configuration can improve a region in which the coffee-ring effect is most severe in the display panel 10.

On a basis of the foregoing concept, a method for manufacturing a display panel 10 is further provided according to an embodiment of the present disclosure. FIG. 11 is a flowchart of a method for manufacturing a display panel according to an embodiment of the present disclosure. The display panel 10 has a display region 101. As shown in FIG. 11, the method includes following steps S10 and S20.

In step S10, a packaging layer 200 is formed at a side of the substrate 100. The packaging layer 200 includes the organic packaging layer 210. The organic packaging layer includes the first packaging portion 211 and the second packaging portion 212 which are different in thickness. The display region 101 includes the first region 102 and the second region 103. The first packaging portion 211 is disposed in the first region 102, and the second packaging portion 212 is disposed in the second region 103.

In step S20, the touch-control electrode is formed at a side of the packaging layer 200 away from the substrate 100. The touch-control electrode is a mesh electrode including multiple first metal lines. A first part of the first metal lines, which is located in the first region 102, is fabricated from a pattern having a first preset width for each first metal line. A second part of the first metal lines, which is located in the second region 103, is fabricated from a pattern having a second preset width for each first metal line, and the second preset width is equal to the first preset width plus a compensation width.

In the foregoing method, the width of the first metal line is compensated during fabricating the first metal lines, and the width difference between the first metal line(s) in the second region 103 and the first metal line(s) in the first region 102 can be effectively reduced through the width compensation. In one embodiment, the width of the first metal line in the second region 103 is closer to the designated width, and the touch sensitivity of the display panel 10 is improved at the positions close to the boundary of the display region 101.

In some embodiments, the display panel 10 further has an opening region 105. The display region 101 surrounds the opening region 105. An inner boundary 1011 of the display region 101 is adjacent to the opening region 105. The second region 103 includes a first sub-region 104 adjacent to the inner boundary 1011. In the foregoing method, the first sub-region 104 is divided into a first compensation region 1041 and a second compensation region 104. The first compensation region 1041 is annular and surrounds the opening region 105, and an inner edge of the first compensation region 1041 coincides with the inner boundary 1011. The second compensation region 1042 is annular and surrounds the first compensation region 1041, and an inner edge of the second compensation region 1042 coincides with an outer edge of the first compensation region 1041. The compensation width is equal to a first compensation width in the first compensation region 1041 and is equal to a second compensation width in the second compensation region 1042. The first compensation width is greater than the second compensation width.

In one embodiment, the width of the first metal line is compensated at positions close to the opening region 105, and a larger compensation width is applied to the first metal line(s) in the first compensation region 1041 which is closer to the opening region 105. Such configuration is capable to improve an effect of width compensation, and the width of the first metal line in the first sub-region 104 is quite close to the designated width. In one embodiment, the touch sensitivity of the display panel 10 is improved at the positions close to the opening region 105.

In some embodiments, the second region 103 includes a second sub-region 106 located adjacent to the outer boundary 1012 of the display panel 10. In the foregoing method(s), the second sub-region 106 is divided into the third compensation region 1061 and the fourth compensation region 1062. The third compensation region 1061 is shaped as a closed loop, and an outer edge of the third compensation region 1061 coincides with the outer boundary 1012. The fourth compensation region 1062 is shaped as another closed loop surrounding the first region 102, and an outer edge of the fourth compensation region 1062 coincides with an inner edge of the third compensation region 1061. The compensation width is equal to a third compensation width in the third compensation region 1061 and is equal to a fourth compensation width in the fourth compensation region 1062. The third compensation width is greater than the fourth compensation width.

In one embodiment, the width of the first metal line is compensated at positions close to the outer boundary 1012 of the display region 101, and a larger compensation width is applied to the first metal line(s) in the third compensation region 1061 which is closer to the outer edge 1012. Such configuration is capable to improve an effect of width compensation, and the width of the first metal line in the second sub-region 104 is quite close to the designated width. In one embodiment, the touch sensitivity of the display panel 10 is improved at the positions close to the outer edge 1012.

In some embodiments, the display panel 10 has an opening region 105, and the display region 101 surrounds the opening region 105. The display region 101 has an outer boundary 1012 and an inner boundary 1011 that is adjacent to the opening region 105. The outer boundary 1012 includes a first edge 10121, and a distance between the inner boundary 1011 and the first edge 10121 is less than a preset distance. In the foregoing method(s), the second sub-region 106 is divided into a fifth compensation region 1071, a sixth compensation region 1072, and a seventh compensation region 1073. The fifth compensation region 1071 is disposed between the inner boundary 1011 and the first edge 10121, and an edge of the fifth compensation region 1071 far away from the opening region 105 coincides with a portion of the first edge 10121. There are two sixth compensation regions 1072, which are located at two sides, respectively, of the fifth compensation region 1071 along the first direction. An edge of the sixth compensation region 1072 away from the opening region 105 coincides with the first edge 10121. The seventh compensation region 1073 is at located a side, of the fifth compensation region 1071 and the sixth compensation region 1072, away from the first edge 10121, and a portion of the edge of the seventh compensation region 1073 coincides with a portion of the inner boundary. The compensation width is equal to a fifth compensation width in the fifth compensation region 1071, equal to a sixth compensation width in the sixth compensation region 1072, and equal to a seventh compensation width in the seventh compensation region 1073. The fifth compensation width is greater than the sixth compensation width, and the sixth compensation width is greater than the seventh compensation width.

In one embodiment, the distance between the inner boundary 1011 and the first edge 10121 is considered to be small when it is less than the preset distance. In such case, the width of the first metal line in a region between the opening region 105 and the first edge 10121 needs to be compensated. The fifth compensation width is applied to the first metal line(s) in the fifth compensation region 1071. The sixth compensation width is applied to the first metal line(s) in the sixth compensation region 1072. The seventh compensation width is applied to the first metal line(s) in the seventh compensation region 1073. The fifth compensation width is greater than the sixth compensation width, and the sixth compensation width is greater than the seventh compensation width. Such configuration can achieve a better effect of width compensation.

As an example, the preset distance is 3000 μm.

On a basis of the foregoing concept, a display device 1 is further provided according to an embodiment of the present disclosure. FIG. 12 is a schematic structural diagram of a display device 1 according to an embodiment of the present disclosure. The display device 1 includes the display panel 10 according to any foregoing embodiment.

Since the display device 1 and the display panel 10 share the same concept, the display device 1 is capable to achieve the same beneficial effect as the display panel 10 in the foregoing embodiments. Details of the display device 1 may refer to those of the display panel 10 as described above and would not be repeated herein.

Herein the display device 1 may be a mobile phone as shown in FIG. 12 or may be any electronic product with a display function. The display device includes, but is not limited to, a television, a laptop, a desktop display, a tablet computer, a digital camera, a smart bracelet, smart glasses, a vehicle-mounted display, an industrial control device, a medical display, a touch-control interactive terminal, and the like. The present disclosure is not limited to the above examples.

Embodiments may be arbitrarily combined. For the sake of conciseness, not all possible combinations of the features in the foregoing embodiments are enumerated. These combinations shall fall within the scope of the present disclosure, as long as there is no contradiction.

Hereinabove only several implementations of the present disclosure are described in detail, and these implementations shall not be construed as a limitation to the scope of the present disclosure. The concept of the present disclosure, and the modifications and improvements fall within the protection scope of the present disclosure. Therefore, the protection scope of the present disclosure is subject to the claims.

What is claimed is:

1. A display panel, comprising:

a substrate;

a packaging layer disposed at a side of the substrate, wherein:

the packaging layer comprises an organic packaging layer, the organic packaging layer comprises a first packaging portion and a second packaging portion which are different in thickness, and the display region comprises a first region, in which the first packaging portion is disposed, and a second region, in which the second packaging portion is disposed; and a touch-control electrode, disposed at a side of the packaging layer away from the substrate, wherein:

the touch-control electrode is a mesh electrode comprising a plurality of first metal lines, an average width of the plurality of first metal lines in the first region is equal to a first width, an average width of the plurality of first metal lines in the second region is equal to a compensated width, and the plurality of first metal lines is subject to width compensation in the second region;

an absolute difference between the first width and the compensated width ranges from 0 to 0.32 μm; and at least one of:

a first opening region of the display panel is surrounded by the display region, an inner boundary of the display region is adjacent to the first opening region, the second region comprises a first sub-region adjacent to the inner boundary, and the first sub-region comprises a first compensation region surrounding the first opening region and a second compensation region surrounding the first compensation region;

the second region comprises a second sub-region adjacent to an outer boundary of the display region, the second sub-region comprises a third compensation region and a fourth compensation region surrounding the first region, and the third compensation region surrounds the fourth compensation region; or a second opening region of the display panel is surrounded by the display region, an inner boundary of the display region is adjacent to the second opening region, an outer boundary of the display region comprises a first edge, the second region comprises a third sub-region adjacent to the first edge, and the third sub-region comprises:

a fifth compensation region located between the inner boundary and the first edge, two sixth compensation regions located at two sides, respectively, of the fifth compensation region along a first direction parallel with the first edge, and a seventh compensation region located at a side, of the fifth compensation region and the two sixth compensation regions, away from the first edge.

2. The display panel according to claim 1, wherein:

the second region comprises the first sub-region;

the first compensation region is annular, and an inner edge of the first compensation region coincides with the inner boundary;

the second compensation region is annular, and an inner edge of the second compensation region coincides with an outer edge of the first compensation region;

a radial distance between the outer edge of the first compensation region and the inner edge of the first compensation region ranges from 850 μm to 950 μm, and a radial distance between an outer edge of the second compensation region and the inner edge of the second compensation region ranges from 550 μm to 650 μm;

an average width of the plurality of first metal lines in the first compensation region is equal to a second width, and an average width of the plurality of first metal line in the second compensation region is equal to a third width; and an absolute difference between the second width and the first width ranges from 0 to 0.27 μm, and an absolute difference between the third width and the first width ranges from 0 to 0.24 μm.

3. The display panel according to claim 1, wherein:

the second region comprises the second sub-region;

the third compensation region is shaped as a closed loop, and an outer edge of the third compensation region coincides with the outer boundary;

the fourth compensation region is shaped as another closed loop, and an outer edge of the fourth compensation region coincides with the inner edge of the third compensation region;

a distance between the inner edge of the third compensation region and the outer edge of the third compensation region ranges from 850 μm to 950 μm, and a distance between an inner edge of the fourth compensation region and the outer edge of the fourth compensation region ranges from 550 μm to 650 μm;

an average width of the plurality of first metal lines in the third compensation region is equal to a fourth width, and an average width of the plurality of first metal lines in the fourth compensation region is equal to a fifth width; and an absolute difference between the fourth width and the first width ranges from 0 to 0.29 μm, and an absolute difference between the fifth width and the first width ranges from 0 to 0.25 μm.

4. The display panel according to claim 1, wherein:

the second region comprises the third sub-region, and a distance between the inner boundary and the first edge is less than 300 μm;

an edge of the fifth compensation region away from the second opening region coincides with a portion of the first edge;

an edge of each of the two sixth compensation regions away from the second opening region coincides with the first edge; and a portion of an edge of the seventh compensation region coincides with a portion of the inner boundary.

5. The display panel according to claim 4, wherein:

a length of the fifth compensation region along a second direction perpendicular to the first edge is greater than a half, while less than or equal to four fifths, of a distance between the inner boundary and the first edge;

a length of the fifth compensation region along the first direction is greater than or equal to, while less than or equal to 1.3 times of, a diameter of the second opening region; and an average width of the plurality of first metal lines in the fifth compensation region is equal to a sixth width, and an absolute difference between the sixth width and the first width ranges from 0 to 0.32 μm.

6. The display panel according to claim 4, wherein:

a length of each of the two sixth compensation regions along a second direction perpendicular to the first edge is equal to a length of the fifth compensation region along the second direction;

a length of each of the two sixth compensation regions along the first direction is greater than or equal to one third, while less than or equal to a half, of a length of the fifth compensation region along the first direction; and an average width of the plurality of first metal lines in the two sixth compensation regions is equal to a seventh width, and an absolute difference between the seventh width and the first width ranges from 0 to 0.29 μm.

7. The display panel according to claim 4, wherein:

a length of the seventh compensation region along a second direction perpendicular to the first edge is greater than one fifth, while less than or equal to one third, of a distance between the inner boundary and the first edge;

a length of the seventh compensation region along the first direction is equal to a sum of a length of the fifth compensation region along the first direction and lengths of the two sixth compensation regions along the first direction; and an average width of the plurality of first metal lines in the seventh compensation region is equal to an eighth width, and an absolute difference between the eighth width and the first width ranges from 0 to 0.26 μm.

8. The display panel according to claim 4, wherein:

the third sub-region further comprises an eighth compensation region, which is located between the sixth compensation region and the seventh compensation region along a second direction perpendicular to the first edge and at a side of one of the two sixth compensation regions away from the fifth compensation region along the first direction;

at least a part of a periphery of the sixth compensation region contacts the eighth compensation region;

a length of the eighth compensation region along the second direction is greater than or equal to one third, while less than or equal to a half, of a length of the sixth compensation region along the second direction;

a length of the eighth compensation region along the first direction is greater than or equal to one third, while less than or equal to a half, of a length of the sixth compensation region along the first direction; and an average width of the first metal lines in the eighth compensation region is equal to a ninth width, and an absolute difference between the ninth width and the first width ranges from 0 to 0.21 μm.

9. The display panel according to claim 4, wherein:

the mesh electrode comprising a bridging portion, and the bridging portion comprises a plurality of second metal lines;

a length of the fifth compensation region along a second direction perpendicular to the first edge is greater than a half, while less than or equal to four fifths, of a distance between the inner boundary and the first edge;

a length of the fifth compensation region along the first direction is greater than or equal to, while less than or equal to 1.3 times of, the diameter of the second opening region;

a length of each of the two sixth compensation regions along the second direction is equal to the length of the fifth compensation region along the second direction;

a length of each of the two sixth compensation regions along the first direction is greater than or equal to one third, while less than or equal to a half, of the length of the fifth compensation region along the first direction;

a length of the seventh compensation region along the second direction is greater than one fifth, while less than or equal to one third, of the distance between the inner boundary and the first edge;

a length of the seventh compensation region along the first direction is equal to a sum of the length of the fifth compensation region along the first direction and lengths of the two sixth compensation regions along the first direction;

an average width of the plurality of second metal lines in the fifth compensation region is equal to a tenth width, and an absolute difference between the tenth width and the first width ranges from 0 to 0.28 μm;

an average width of the plurality of second metal lines in the two sixth compensation regions is equal to an eleventh width, and an absolute difference between the eleventh width and the first width ranges from 0 to 0.26 μm; and an average width of the plurality of second metal lines in the seventh compensation region is equal to a twelfth width, and an absolute difference between the twelfth width and the first width ranges from 0 to 0.23 μm.

10. The display panel according to claim 1, wherein the packaging layer further comprises:

a first inorganic packaging layer disposed at a side of the organic packaging layer facing the substrate;

a second inorganic packaging layer disposed at a side of the organic packaging layer away from the first inorganic packaging layer; and a planarization layer disposed between the organic packaging layer and the second inorganic packaging layer, wherein and the planarization layer is located in the first region and a portion of the second region.

11. The display panel according to claim 1, wherein:

the first opening region is surrounded by the display region, an inner boundary of the display region is adjacent to the first opening region, a first non-display region of the display panels surrounds the display region, and a second non-display region of the display panel is located between the inner boundary and the first opening region; and the display panel further comprises:

a first barrier, disposed in the first non-display region and surrounding the display region;

a second barrier, disposed in the second non-display region and surrounding the first opening region;

a first shielding wall, disposed in the first non-display region and between the display region and the first barrier; and a second shielding wall, disposed in the second non-display region and between the display region and the second barrier.

12. The display panel according to claim 11, wherein:

the packaging layer further comprises a first inorganic packaging layer and a second inorganic packaging layer, the organic packaging layer is disposed at a side of the first inorganic packaging layer away from the substrate, and the second inorganic packaging layer is disposed at a side of the organic packaging layer away from the first inorganic packaging layer; and an orthographic projection of the first shielding wall on the substrate is within an orthographic projection of the organic packaging layer on the substrate, and an orthographic projection of the second shielding wall on the substrate is within the orthographic projection of the organic packaging layer on the substrate.

13. The display panel according to claim 11, wherein:

the first shielding wall comprises a plurality of segments, among which a first segment has a minimum distance to the first opening region;

a direction along which the first shielding wall extends is parallel to a direction along which the first segment extends; and a length of the first shielding wall is greater than or equal to the diameter of the first opening region, and less than or equal to three times the diameter of the first opening region.

14. A method for manufacturing a display panel, comprising:

forming a packaging layer at a side of a substrate, wherein:

the packaging layer comprises an organic packaging layer, the organic packaging layer comprises a first packaging portion and a second packaging portion which are different in thickness due to a coffee-ring effect, and a display region of the display panel comprises a first region, in which the first packaging portion is disposed, and a second region, in which the second packaging portion is disposed, and the second region is closer to a boundary of the display region than the first region; and forming a touch control electrode at a side of the packaging layer away from the substrate, wherein:

the touch-control electrode is a mesh electrode comprising a plurality of first metal lines, the plurality of first metal lines in the first region is fabricated from a pattern having a first preset width for each first metal line, the plurality of first metal lines in the second region is fabricated from another pattern having a second preset width for each first metal line, and the second preset width is equal to the first preset width plus a compensation width, wherein the compensation width is determined based on a degree of the coffee-ring effect.

15. The method according to claim 14, wherein:

an opening region of the display panel is surrounded by the display region, and an inner boundary of the display region is adjacent to the opening region;

the second region comprises a first sub-region adjacent to the inner boundary, and the first sub-region comprises a first compensation region and a second compensation region;

the first compensation region annular and surrounds the opening region, and an inner edge of the first compensation region coincides with the inner boundary;

the second compensation region is annular and surrounds the first compensation region, and an inner edge of the second compensation region coincides with an outer edge of the first compensation region; and the compensation width is equal to a first compensation width in the first compensation region and is equal to a second compensation width in the second compensation region, and the first compensation width is greater than the second compensation width.

16. The method according to claim 14, wherein:

the second region comprises a second sub-region adjacent to an outer boundary of the display region, and the second sub-region comprises a third compensation region and a fourth compensation region;

the third compensation region is shaped as a closed loop, and an outer edge of the third compensation region coincides with the outer boundary;

the fourth compensation region is shaped as a closed loop surrounding the first region, and an outer edge of the fourth compensation region coincides with an inner edge of the third compensation region; and the compensation width is equal to a third compensation width in the third compensation region and is equal to a fourth compensation width in the fourth compensation region, and the third compensation width is greater than the fourth compensation width.

17. The method according to claim 14, wherein:

an opening region of the display panel is surrounded by the display region, an inner boundary of the display region is adjacent to the opening region, an outer boundary of the display region comprises a first edge, and a distance between the inner boundary and the first edge is less than a preset distance;

the second region comprises a fifth compensation region, two sixth compensation regions, and a seventh compensation region;

the fifth compensation region is located between the inner boundary and the first edge, and an edge of the fifth compensation region away from the opening region coincides with a portion of the first edge;

the two sixth compensation regions are located at two sides, respectively, of the fifth compensation region along the first direction, and an edge of each of the two sixth compensation regions away from the opening region coincides with the first edge;

the seventh compensation region is located at a side, of the fifth compensation region and the two sixth compensation regions, away from the first edge, and a portion of an edge of the seventh compensation region coincides with a portion of the inner boundary;

the compensation width is equal to a fifth compensation width in the fifth compensation region, is equal to a sixth compensation width in the sixth compensation region, and is equal to a seventh compensation width in the seventh compensation region; and the fifth compensation width is greater than the sixth compensation width, and the sixth compensation width is greater than the seventh compensation width.

18. A display device, comprising a display panel, wherein the display panel comprises:

a substrate;

a packaging layer disposed at a side of the substrate, wherein:

the packaging layer comprises an organic packaging layer, the organic packaging layer comprises a first packaging portion and a second packaging portion which are different in thickness, and the display region comprises a first region, in which the first packaging portion is disposed, and a second region, in which the second packaging portion is disposed; and a touch-control electrode, disposed at a side of the packaging layer away from the substrate, wherein:

the touch-control electrode is a mesh electrode comprising a plurality of first metal lines, an average width of the plurality of first metal lines in the first region is equal to a first width, an average width of the plurality of first metal lines in the second region is equal to a compensated width, and the plurality of first metal lines is subject to width compensation in the second region;

an absolute difference between the first width and the compensated width ranges from 0 to 0.32 μm; and at least one of:

a first opening region of the display panel is surrounded by the display region, an inner boundary of the display region is adjacent to the first opening region, the second region comprises a first sub-region adjacent to the inner boundary, and the first sub-region comprises a first compensation region surrounding the first opening region and a second compensation region surrounding the first compensation region;

the second region comprises a second sub-region adjacent to an outer boundary of the display region, the second sub-region comprises a third compensation region and a fourth compensation region surrounding the first region, and the third compensation region surrounds the fourth compensation region; or a second opening region of the display panel is surrounded by the display region, an inner boundary of the display region is adjacent to the second opening region, an outer boundary of the display region comprises a first edge, the second region comprises a third subregion adjacent to the first edge, and the third subregion comprises:

a fifth compensation region located between the inner boundary and the first edge, two sixth compensation regions located at two sides, respectively, of the fifth compensation region along a first direction parallel with the first edge, and a seventh compensation region located at a side, of the fifth compensation region and the two sixth compensation regions, away from the first edge.

19. The display panel according to claim 1, wherein:

the second opening region is surrounded by the display region, an inner boundary of the display region is adjacent to the second opening region, a first non-display region of the display panels surrounds the display region, and a second non-display region of the display panel is located between the inner boundary and the second opening region; and the display panel further comprises:

a first barrier, disposed in the first non-display region and surrounding the display region;

a second barrier, disposed in the second non-display region and surrounding the second opening region;

a first shielding wall, disposed in the first non-display region and between the display region and the first barrier; and a second shielding wall, disposed in the second non-display region and between the display region and the second barrier.

20. The display panel according to claim 19, wherein:

the first shielding wall comprises a plurality of segments, among which a first segment has a minimum distance to the second opening region;

a direction along which the first shielding wall extends is parallel to a direction along which the first segment extends; and a length of the first shielding wall is greater than or equal to the diameter of the second opening region, and less than or equal to three times the diameter of the second opening region.

* * * * *